(12) United States Patent
Somitsch et al.

(10) Patent No.: US 10,608,163 B2
(45) Date of Patent: Mar. 31, 2020

(54) MULTILAYER COMPONENT HAVING INTERNAL ELECTRODES ALTERNATINGLY CONNECTED TO EXTERNAL ELECTRODES

(71) Applicant: EPCOS AG, München (DE)

(72) Inventors: Dieter Somitsch, Gross St. Florian (AT); Franz Rinner, Deutschlandsberg (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 16/284,744

(22) Filed: Feb. 25, 2019

(65) Prior Publication Data
US 2019/0189895 A1    Jun. 20, 2019

Related U.S. Application Data

(62) Division of application No. 14/380,030, filed as application No. PCT/EP2013/052214 on Feb. 5, 2013, now Pat. No. 10,217,927.

(30) Foreign Application Priority Data

Feb. 20, 2012  (DE) .................. 10 2012 101 351

(51) Int. Cl.
*H01L 41/083* (2006.01)
*H01G 4/12* (2006.01)
(Continued)

(52) U.S. Cl.
CPC .......... *H01L 41/083* (2013.01); *H01G 4/005* (2013.01); *H01G 4/1218* (2013.01); *H01G 4/1236* (2013.01); *H01G 4/1263* (2013.01); *H01G 4/252* (2013.01); *H01G 4/30* (2013.01); *H01G 4/302* (2013.01); *H01L 41/0471* (2013.01); *H01L 41/0472* (2013.01); *H01L 41/0477* (2013.01); *H01L 41/293* (2013.01); *C25D 11/005* (2013.01); *C25D 11/04* (2013.01); *C25D 11/34* (2013.01); *C25D 17/008* (2013.01); *Y10T 29/42* (2015.01); *Y10T 29/43* (2015.01); *Y10T 29/435* (2015.01)

(58) Field of Classification Search
CPC ............... H01L 41/083; H01L 41/0471; H01L 41/0472; H01L 41/0477
See application file for complete search history.

(56) References Cited

U.S. PATENT DOCUMENTS 3,909,369 A    9/1975    Udupa et al.
5,163,209 A *  11/1992   Harada ............... H01L 41/0477
                                                29/25.35
(Continued)

FOREIGN PATENT DOCUMENTS

DE    19542365 A1    5/1997
DE    10345500 A1    4/2005
(Continued)

*Primary Examiner* — J. San Martin
(74) *Attorney, Agent, or Firm* — Slater Matsil, LLP

(57) ABSTRACT

A multilayer component is disclosed. In an embodiment, a multilayer component includes a fully active stack comprising a plurality of dielectric layers, internal electrodes and two external electrodes arranged on opposite sides of the stack, wherein at least one portion of the internal electrode layers are coated.

6 Claims, 6 Drawing Sheets

(51) Int. Cl.
*H01G 4/005* (2006.01)
*H01G 4/252* (2006.01)
*H01G 4/30* (2006.01)
*H01L 41/293* (2013.01)
*H01L 41/047* (2006.01)
*C25D 17/00* (2006.01)
*C25D 11/00* (2006.01)
*C25D 11/04* (2006.01)
*C25D 11/34* (2006.01)

(56) References Cited

U.S. PATENT DOCUMENTS

| | | | |
|---|---|---|---|
| 5,254,212 | A | 10/1993 | Someji et al. |
| 5,281,885 | A | 1/1994 | Watanabe et al. |
| 5,597,494 | A | 1/1997 | Kohno et al. |
| 5,735,027 | A | 4/1998 | Hageman et al. |
| 6,387,227 | B1 | 5/2002 | Hamanaka et al. |
| 6,891,313 | B1 | 5/2005 | Henneken et al. |
| 7,073,265 | B2 | 7/2006 | Senoo et al. |
| 7,525,241 | B2 | 4/2009 | Florian et al. |
| 7,905,000 | B2 | 3/2011 | Ganster et al. |
| 8,237,333 | B2 | 8/2012 | Dorner-Reisel |
| 2009/0320255 | A1 | 12/2009 | Ganster |
| 2010/0206735 | A1 | 8/2010 | Wurm et al. |

FOREIGN PATENT DOCUMENTS

| | | |
|---|---|---|
| DE | 102006011293 A1 | 9/2007 |
| DE | 102007004813 A1 | 8/2008 |
| DE | 202009014076 U1 | 1/2010 |
| EP | 1206804 A1 | 5/2002 |
| JP | S60196981 A | 10/1985 |
| JP | 3174783 A | 7/1991 |
| JP | 5243635 A | 9/1993 |
| JP | 5267743 A | 10/1993 |
| JP | 2005072370 A | 3/2005 |
| JP | 2006203077 A | 8/2006 |
| JP | 2008235698 A | 10/2008 |
| JP | 2009200358 A | 9/2009 |
| JP | 2010517311 A | 5/2010 |
| WO | 2007104678 A1 | 9/2007 |
| WO | 2008092740 A2 | 8/2008 |
| WO | 2008101919 A1 | 8/2008 |

* cited by examiner

MULTILAYER COMPONENT HAVING INTERNAL ELECTRODES ALTERNATINGLY CONNECTED TO EXTERNAL ELECTRODES

CROSS-REFERENCE TO RELATED APPLICATIONS

This is a divisional application of U.S. application Ser. No. 14/380,030, issued on Feb. 26, 2019 as U.S. patent Ser. No. 10/217,927, which is a national phase filing under section 371 of PCT/EP2013/052214, filed Feb. 5, 2013, which claims the priority of German patent application 10 2012 101 351.9, filed Feb. 20, 2012, each of which is incorporated herein by reference in their entirety.

TECHNICAL FIELD

The invention relates to a fully active multilayer component, a method for producing a fully active stack, and a method for producing a fully active multilayer component comprising the fully active stack.

BACKGROUND

Multilayer components encompass capacitors and piezo-actuators, containing in each case alternating dielectric layers and internal electrodes. In the case of the piezo-actuators, the dielectric layers are additionally piezoelectric. Therefore, piezo-actuators are included among the piezo-elements.

Piezo-elements are, inter alia, for positioning elements, ultrasonic transducers, sensors and in inkjet printers and also in automotive engineering for driving fuel elements is based on the deformation of piezo-ceramic materials, such as e.g., lead zirconate titanate, under the action of an electric field. If an electrical voltage is applied to the piezo-element, then the latter expands in a direction perpendicular to the electric field generated (inverse piezo-effect).

Advantages of piezo-elements include, inter alia, the relatively high speed thereof, the relatively high effectiveness thereof and, if used as piezo-actuator, the relatively small actuating travel thereof.

However, if a relatively large actuating travel is intended to be achieved with the piezo-actuator, then a piezo-stack comprising a plurality of alternately successive piezo-electric layers and internal electrode layers is used for the piezo-actuator, as is disclosed e.g., in JP 03174783 A.

The piezo-actuator disclosed in JP 03174783 A is embodied in such a way that the internal electrode layers are electrically connected alternately to external electrodes arranged at opposite outer surfaces of the piezo-stack. The internal electrode layers, which are electrically connected to one of the two external electrodes, are therefore led as far as the outer side at which said external electrode is arranged, for the electrical connection to the external electrode. In order that the internal electrode layers are electrically insulated from the other external electrode, however, the internal electrode layers do not extend as far as the outer side of the piezo-stack at which the further external electrode is arranged. In these regions, the internal electrode layers are set back from the outer side. This is achieved by the piezo-stack being provided with slots filled with silicone resin in these regions.

By virtue of the set-back internal electrode layers, so-called inactive zones arise in piezo-electric layers assigned to these regions. The inactive zones are usually produced during the layered production of the piezo-stack. Owing to tolerances of the processes, stacking, separation, binder removal and grinding during the production of the piezo-stack with inactive zones and on account of the stipulation of a reliable electrical insulation of the internal electrode layers with respect to the corresponding external electrode, relatively large inactive zones of typically up to 10 percent of the piezo-stack cross section arise. The inactive zones, which are permeated by a reduced electric field strength when an electrical voltage is applied to the external electrode layers or internal electrode layers and therefore expand to a lesser extent than the other, so-called active zones of the piezo-electric layers when an electrical voltage is applied. This leads to mechanical stresses in particular in the inactive zones and the edge regions with respect to the inactive zones and can lead to so-called poling cracks in the inactive and active zones of the piezo-electric layers, and also in the external electrodes. The risk of poling cracks is all the higher, the larger the inactive zones.

SUMMARY

Embodiments of the invention specify a multilayer component and a method for producing it in which the performance is improved in operation. Particular embodiments provide a piezo-actuator in which the mechanical stresses in the piezo-ceramic are significantly reduced during the operation of the piezo-actuator.

Embodiments of the invention can be achieved by use of a method for producing a fully active stack or stacked bar or the green precursor thereof. A sintered or unsintered (initial) stack having the sides A, B, C and D running in each case in the stacking direction is provided. The stack comprises a plurality of alternately successive ceramic dielectric layers and internal electrode layers. The internal electrode layers are embodied in each case in a continuous fashion with respect to the sides A and C and are embodied in each case in a non-continuous fashion with respect to either the side B or the side D, such that one portion of the internal electrodes or the unsintered precursors thereof make contact with the side B, but not with the side D, and another portion of the internal electrodes or the unsintered precursors thereof make contact with the side D, but not with the side B. The method includes combining and temporarily making contact with the internal electrodes that make contact with the respective side or the unsintered precursors of said internal electrodes on one of the sides B or D via an external contact with temporary isozones, such that the internal electrodes that make contact with the respective side can be electrically driven selectively. The electrically driven internal electrodes or the unsintered precursors thereof are electrochemically coated on the sides A and C. The stack is singulate to form a fully active stack or the green precursor thereof with the electrochemically coated internal electrodes or the unsintered precursors thereof on the sides A' and C'.

If a fully active piezo-stack is intended to be produced by the method, ceramic piezo-electric layers are used for the ceramic dielectric layers. Preferably, the initial (stack) comprises regions in which the internal electrode layers make contact with the sides A and D alternately in each case. With particular preference, in the initial (stack) all the internal electrode layers make contact with the sides A and D alternately in each case.

Further embodiments of the invention provide a method for producing a fully active multilayer component comprising the fully active stack produced according to the above method. In specific detail, for this purpose, a fully active stack or the green precursor thereof is produced according to the above method and sintered, if appropriate. Afterward, external electrodes are applied on the sides A' and C' of the fully active stack and the electrochemically coated or uncoated internal electrodes are contact-connected thereby, such that the two external electrodes are electrically connected either to the electrochemically coated or to the uncoated internal electrodes.

Yet other embodiments of the invention is achieved provide a fully active multilayer component comprising a fully active stack comprising a plurality of dielectric layers and internal electrode layers and two external electrodes arranged on opposite sides of the stack. At least one portion of the internal electrode layers are electrochemically coated. The two external electrodes are electrically connected in each case either to the electrochemically coated or to the electrochemically uncoated internal electrodes. The electrical connection of the two external electrodes to a portion of the internal electrodes either is interrupted by an oxide layer on the internal electrodes or is produced by an electrolytic coating of the internal electrodes. The fully active multilayer component comprises a capacitor and a piezo-actuator. If a fully active piezo-actuator is intended to be provided, the ceramic dielectric layers are ceramic piezo-electric layers.

In one particular embodiment according to the invention, the oxide layer contains a metal which differs from the metal contained in the internal electrodes, preferably by being more electronegative than a metal used in the internal electrodes. By way of example, the oxide layer can comprise aluminum in the case of copper-containing internal electrodes.

In a further particular embodiment according to the invention, the electrical connection of the external electrodes to a portion of the internal electrodes is produced by means of an electrolytic coating of the internal electrodes and the electrical connection of the external electrodes to the rest of the internal electrodes is interrupted by a narrow isozone composed of ceramic having a width of 50 to 200 μm, preferably 50 to 100 μm.

According to the invention, a fully active stack should be understood to mean a stack in which the internal electrodes are continuous, i.e., extend over the entire cross-sectional area of the stack. As a result of this configuration, the entire internal electrodes extend as far as the outer side of the stack, for which reason the latter has no inactive zones. As a result, the performance of the multilayer component during operation is improved and, in the case of the piezo-actuator, the magnitude of the mechanical stresses in the piezo-ceramic is reduced during operation.

The (initial) stack provided in the method for producing a fully active stack is produced, for example, by at least two partial stacks being stacked alternately, wherein each of the partial stacks has a dielectric layer and an internal electrode layer arranged thereon. In this case, the stack provided is produced, in particular, by so-called green ceramic sheets being printed with metallic pastes, for example, using the screen printing method. In this case, the printing is performed in such a way that the metallic pastes completely cover the ceramic green sheet, wherein an unprinted edge is left on one side. The metallic pastes comprise e.g., AgPd or Cu particles, solvents and further additives. Afterward, typically approximately 300 to 600 green ceramic sheets provided with the paste from the two partial stacks are placed one above another in such a way that a block arises in which the metallic intermediate layers make contact with two opposite sides alternately and every second intermediate layer is oriented identically with respect to the unprinted edge. The stack produced is then processed by pressing to form a so-called green block. Afterward, the green block is subjected to binder removal in order to remove solvent residues and is sintered, if appropriate. From a green block, if appropriate, a plurality of (initial) stacks or stacked bars can be produced by means of separation into individual stacks.

In the method for producing a fully active stack or the green precursor thereof, the (initial) stack provided in the first step can be either sintered or green. If the stack is sintered, this has the advantage that the risk of impairment of the ceramic intermediate layers in the piezo-stack during the implementation of the electrochemical coating is low.

In one embodiment according to the invention, the process of electrochemically coating the electrically driven internal electrodes on the sides A and C is carried out by means of electrochemical oxidation, preferably by anodic oxidation. According to the invention, anodic oxidation is understood to mean an electrolytic method for producing oxidic layers on metals. Alternatively, the process of electrochemical coating can be effected by means of plating technology or electroplating. According to the invention, plating technology or electroplating is understood to mean the electrochemical deposition of metallic layers on articles.

In one particular embodiment according to the invention, before the process of electrochemical coating all the internal electrodes are etched back, preferably according to the principle of electrochemical machining. According to the invention, electrochemical machining is understood to mean a method for removing metal by an electrochemical method.

In one particular embodiment according to the invention, after the process of electrochemical coating by means of plating technology the uncoated internal electrodes are covered with insulating material. If etching back was effected before the process of electrochemical coating by means of plating technology, the process of electrochemical coating by means of plating technology is preferably carried out beyond the etching depth.

In one particular embodiment according to the invention, after the process of electrochemical coating by means of plating technology the coating is converted into an insulating oxide coating by electrochemical oxidation, preferably by anodic oxidation. For this purpose, an electrolytic coating material that differs from the material of the internal electrode is preferably used. Preferably, the electrolytic coating material is more readily oxidizable than the material of the internal electrode. By way of example, a metal or a metal mixture containing aluminum can be used if the internal electrodes comprise copper.

In one particular embodiment according to the invention, the trenches that are not filled again after the etching-back process are closed by sintering. In this case, a green piezo-stack is preferably taken as a starting point in the method for producing a fully active piezo-stack. In this way, a particularly economic method is possible since an additional insulating material or method steps for applying the latter can be dispensed with. Moreover, particularly narrow inactive zones or isozones having a width of 50 to 200 μm, preferably 50 to 100 μm, can be produced in this way.

In one particular embodiment according to the invention, the electrochemical coating is carried out in an aqueous NaCl solution as electrolyte. An AC voltage, e.g., 50 HZ, can be used in this case. For this purpose, the internal electrodes preferably consist of silver or a silver alloy, with further preference AgPd. In this way, a silver oxide layer grows on the voltage-carrying electrodes (see, e.g., BAEWA, W. "Oxidation von Silber durch Wechselstrom von 50 HZ in wässriger Natriumlosung" ["Oxidation of silver by AC current at 50 Hz in aqueous sodium solution"] in Werkstoffe and Korrosion, volume 22, edition 2, page 143 et seq., issue February 1971).

BRIEF DESCRIPTION OF THE DRAWINGS

Exemplary embodiments of the invention are illustrated by way of example in the accompanying schematic drawings, in which.

DETAILED DESCRIPTION OF ILLUSTRATIVE EMBODIMENTS

Figure 2:
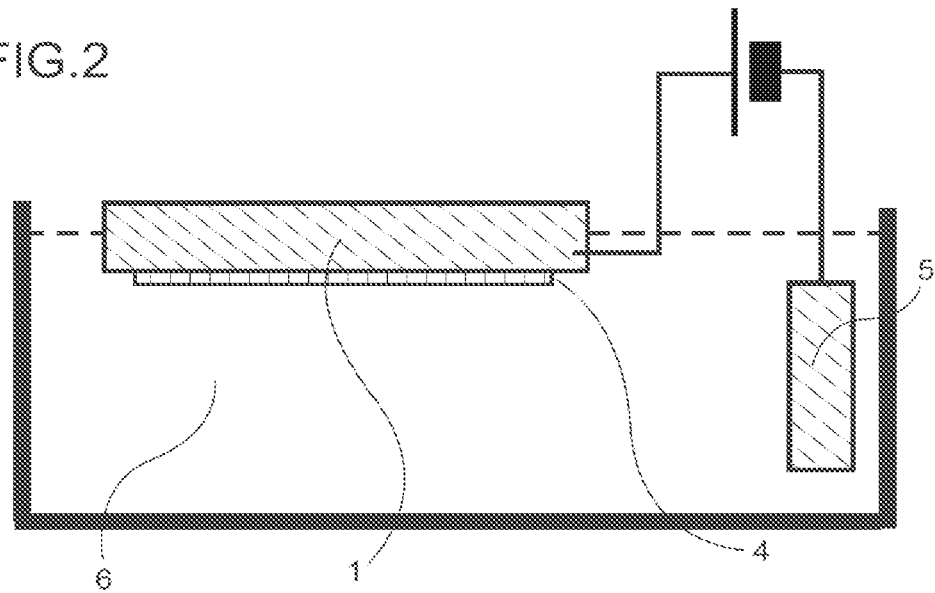
FIG. 2 shows an electrolysis bath for electrochemically coating a piezo-stack.
Figure 3A:
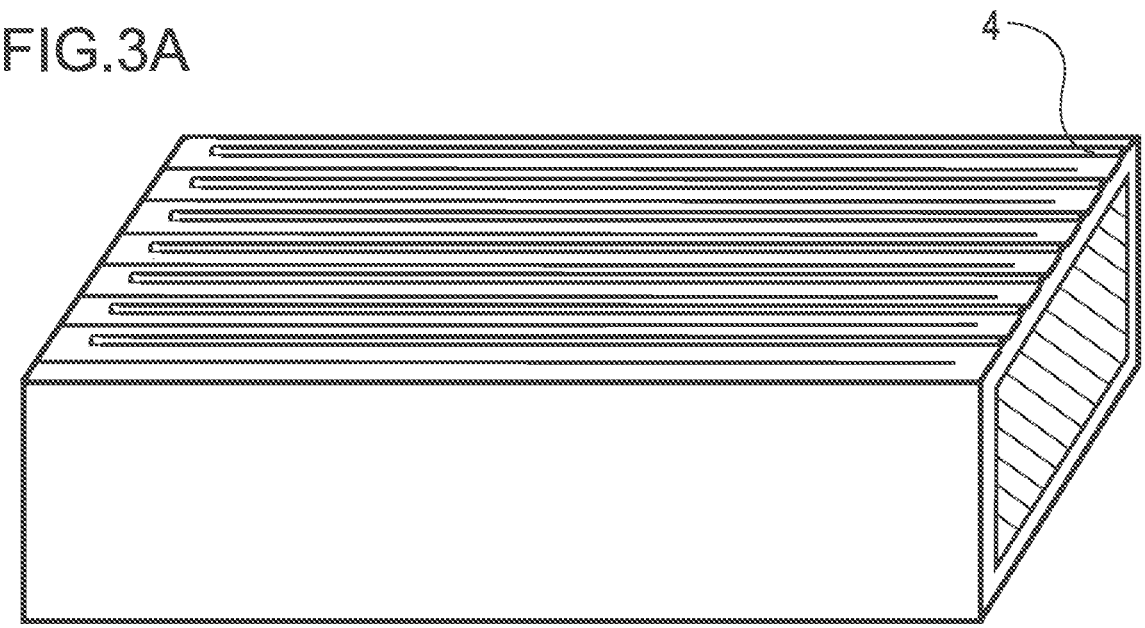
FIGS. 3A and 3B show the oxide layers applied on the internal electrodes.
Figure 3B:
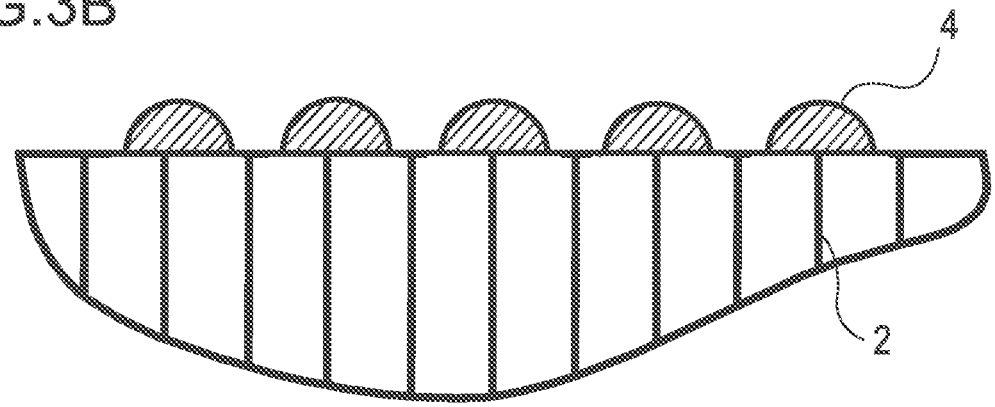
Figure 4:
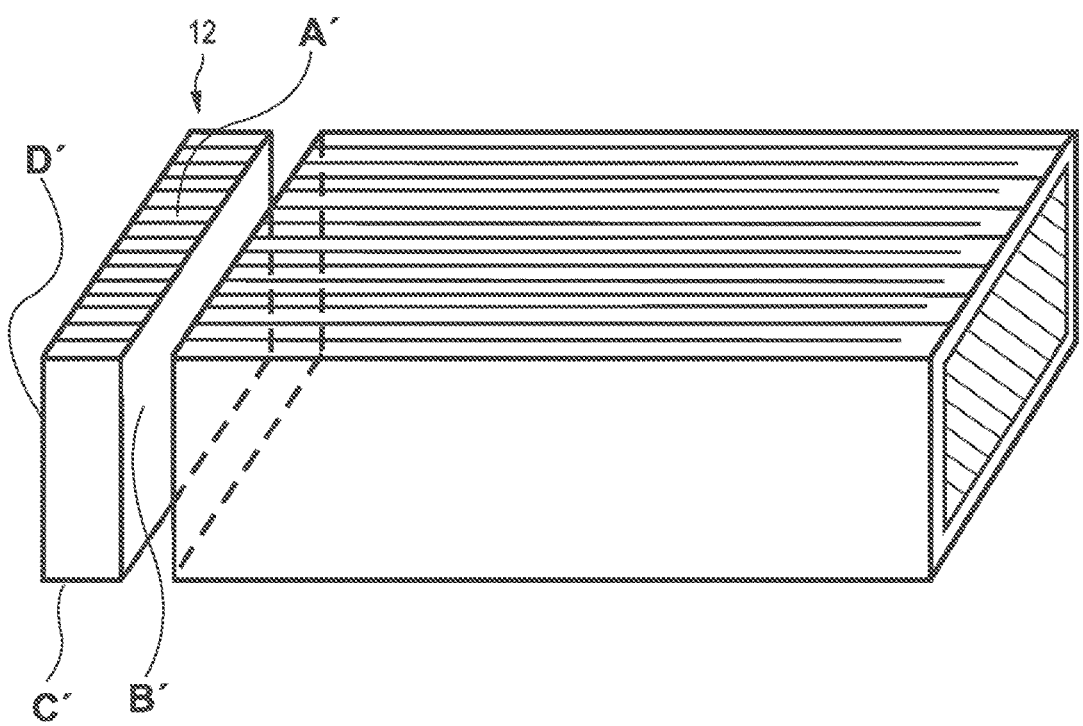
FIG. 4 shows a singulated fully active piezo-stack having the sides A', B', C' and D' along the stacking direction.

In a first exemplary embodiment, the process sequence is as follows.

a) A sintered piezo-stack (1) having the sides A, B, C and D along the stacking direction is provided. The piezo-stack has (temporary) isozones and external contact-connections (3), such that every second internal electrode (2) on the side B can be electrically driven via the external contact-connection (3) and every second internal electrode (2') can be electrically driven via the corresponding external contact-connection (3', not shown), on the side D (see, e.g., FIG. 1).

b) The piezo-stack (1) is dipped on one side (side C) into an electrolyte solution (6) (FIG. 2), (positive) voltage is applied to the piezo-stack (1) at the external contact-connection (3) of the side B, negative voltage is applied to the counterelectrode (5), and energization takes place for a few minutes. An oxide layer (4) forms at the voltage-carrying internal electrodes (2) of the piezo-stack (1) (see, e.g., FIG. 2, FIG. 3A and FIG. 3B). The principle of anodic oxidation is used in this case.

c) Method step b) is carried out analogously for the side A of the piezo-stack (1).

d) The piezo-stack (1) with the coated internal electrodes (2, 2') is singulated to form fully active piezo-stacks (12) (FIG. 4).

e) External electrodes (11) are applied on the sides A' and C' by metallization with conductive adhesive or metallization paste, said external electrodes, in each case on the corresponding side, making electrical contact with the internal electrodes not provided with an oxide layer, i.e., internal electrodes (2') on side A' and respectively internal electrode (2) on side C'.

Steps d) and e) can also be processed in the reverse order.

In one variant of the first exemplary embodiment, an aqueous NaCl solution is used as electrolyte and an electrical AC voltage is applied between the piezo-stack (1) via the internal electrodes (2) driven by the external contact-connection (3) and the counterelectrode (5). In this variant, the internal electrodes consist of silver or a silver alloy, e.g. AgPd, as a result of which a silver oxide layer grows on the voltage-carrying electrodes (see, e.g., BAEWA, W. "Oxidation von Silber durch Wechselstrom von 50 HZ in wässriger Natriumchloridlôsung" ["Oxidation of silver by AC current at 50 HZ in aqueous sodium chloride solution"] in Werkstoffe and Korrosion, volume 22, edition 2, page 143 et seq., issue February 1971).

In a further variant of the first exemplary embodiment, the internal electrodes (2, 2') to be coated are firstly removed 1 to 10 µm, preferably 1 to 5 µm, into the depth by the principle of electrochemical machining, as a result of which electrochemically etched-back trenches (9) arise. Afterward, the process of anodic oxidation is carried out, if appropriate by changing the electrolyte. As a result, an oxide layer is obtained which extends further into the component depth and thus ensures better insulation.

Figure 1:
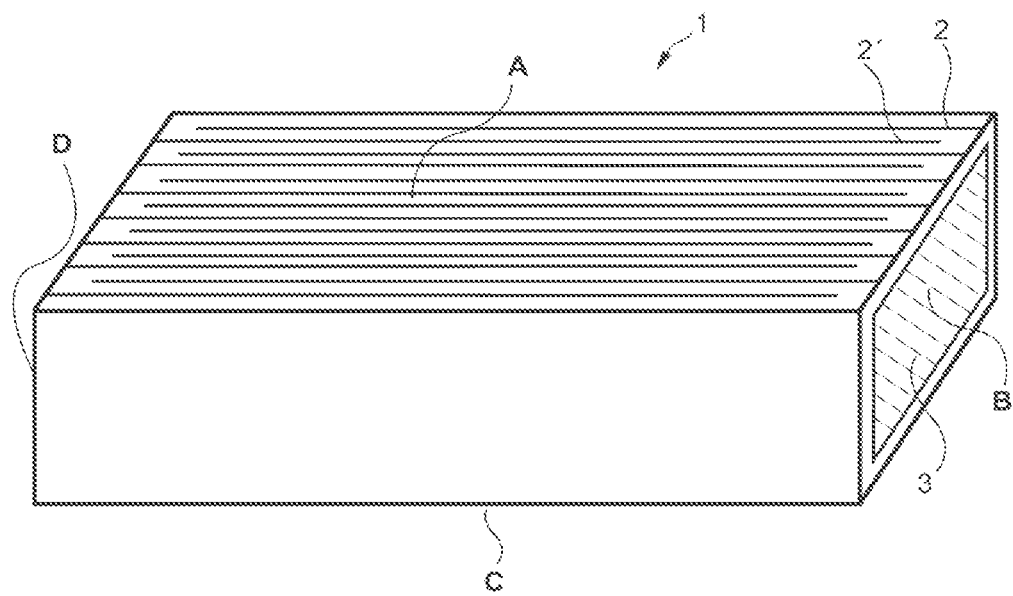
FIG. 1 shows a perspective side view of a piezo-stack having the sides A, B, C and D along the stacking direction.
Figure 5A:
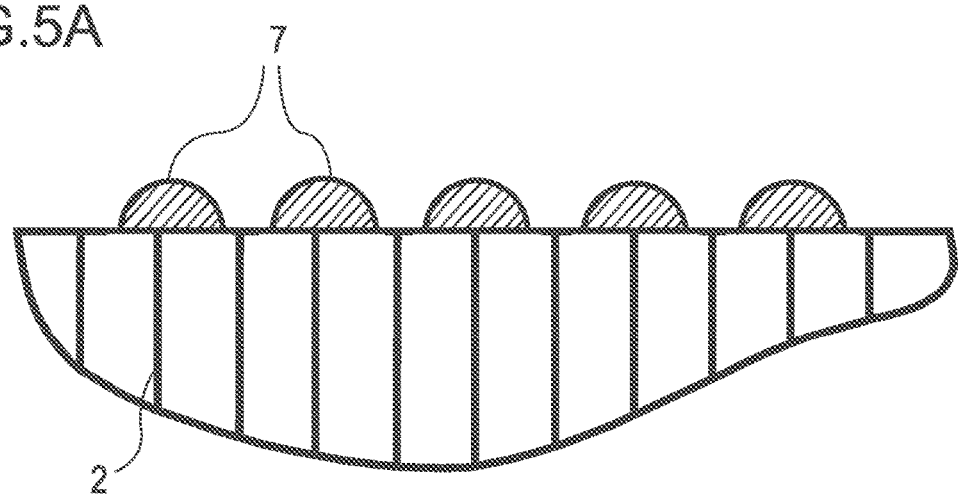
FIG. 5A shows a piezo-stack with applied electrolytic coating over the electrically driven internal electrodes.
Figure 5B:
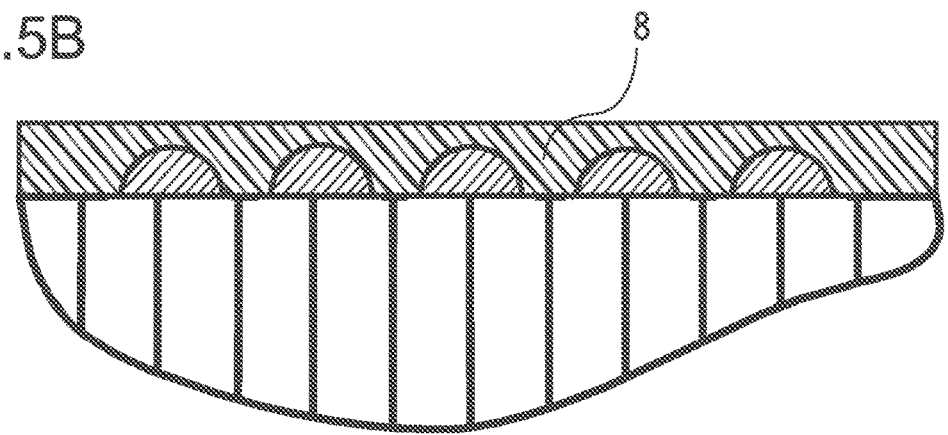
FIG. 5B shows a piezo-stack with additionally applied insulation material.
Figure 5C:
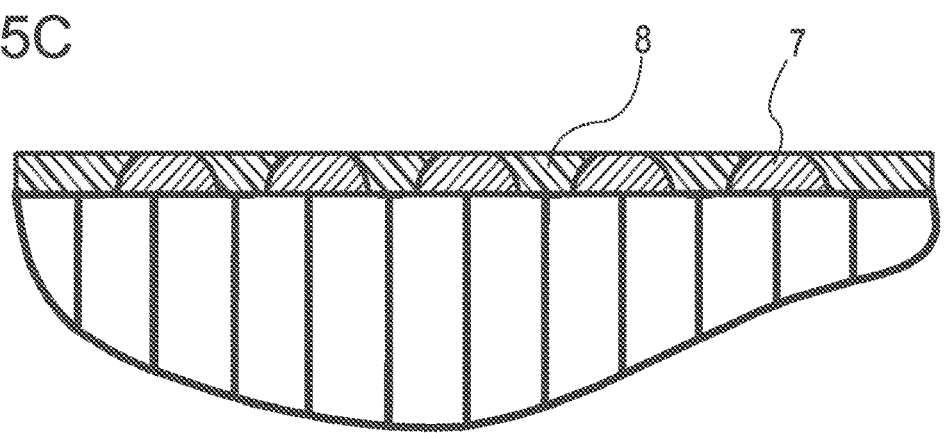
FIG. 5C shows the piezo-stack after a further polishing step, such that the electrolytic coating is exposed.
Figure 6A:
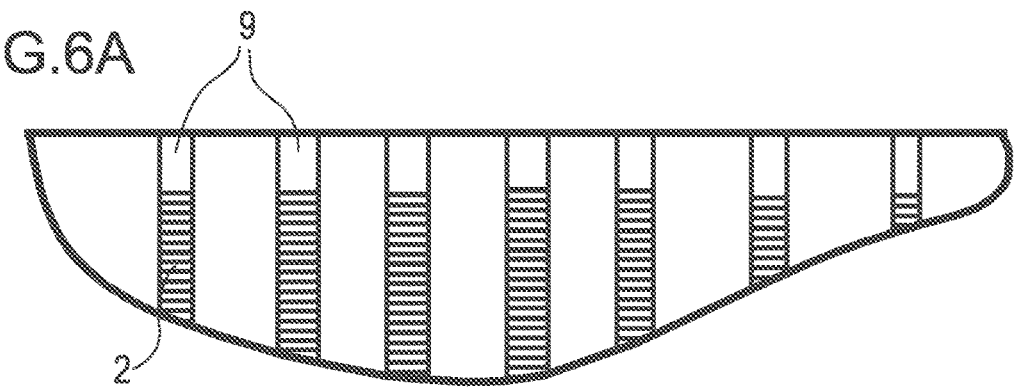
FIG. 6A shows a piezo-stack with internal electrodes etched back to form trenches.
Figure 6B:
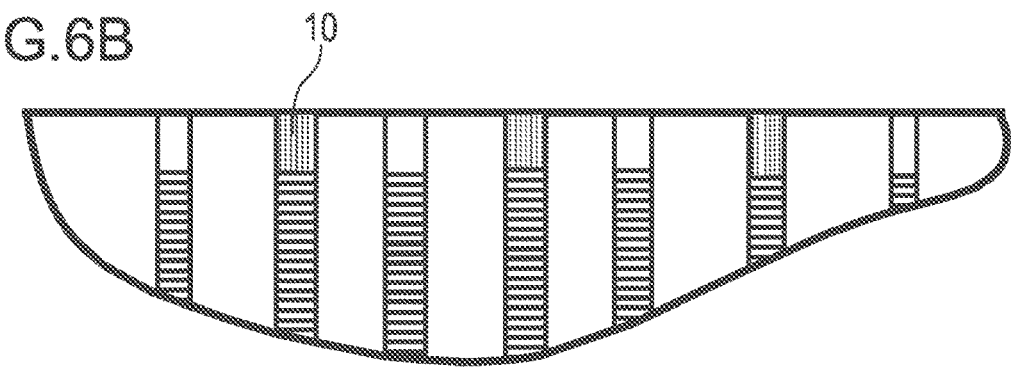
FIG. 6B shows a piezo-stack with trenches partly filled again by electrolytic coating.
Figure 6C:
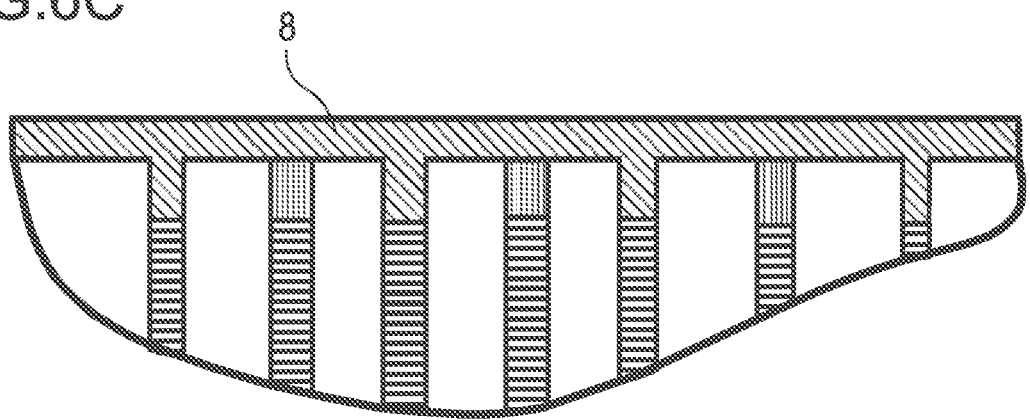
FIG. 6C shows the piezo-stack additionally coated with insulation material with the remaining trenches being filled.
Figure 6D:
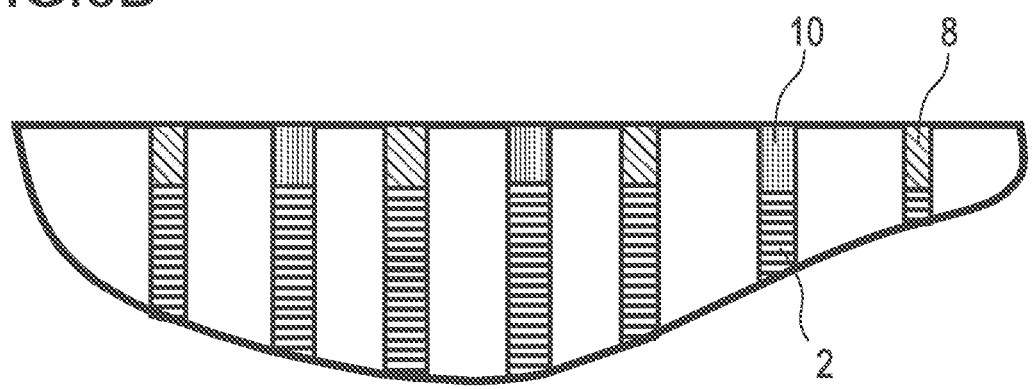
FIG. 6D shows the piezo-stack after an additional polishing step.
Figure 6E:
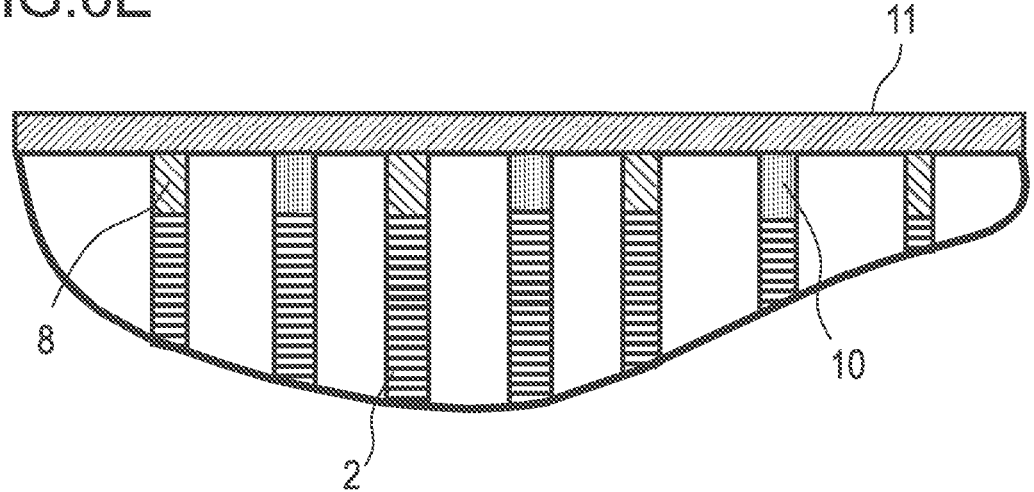
FIG. 6E shows the fully active piezo-stack finally provided with an external electrode.

In a second exemplary embodiment, the process is carried out as follows.

a) A sintered piezo-stack (1) having lateral (temporary) isozones and external contact-connections (3) is provided (FIG. 1).

b) The side C of the component is dipped into a plating technology coating basin, and negative potential is applied to the internal electrodes (2) via the external contact-connection (3) on the side B of the piezo-stack (1). A metal layer several µm thick (typically 10 to 20 µm) is deposited (process of plating technology) at the now voltage-carrying internal electrodes (2) (cathodes).

c) Method step b) is now repeated analogously for the side A.

d) The structured surface of the piezo-stack (1) (see, e.g., FIG. 5A) is now smoothed with insulation material (8) (see, e.g., FIG. 5B). Glass or organic lacquer is preferably used as insulation material.

e) The surfaces A and C of the bar are polished, such that the plated outwardly situated electrodes (7) are sufficiently free and suitable for a further metallization (e.g., spattering, regrinding, etc.). The more deeply situated electrodes still remain insulated from the surface as a result of this cleaning step.

f) An external metallization is now applied on sides A and C and the piezo-stack is singulated to form fully active piezo-stacks and processed further.

In a third exemplary embodiment, the process sequence is as follows (see, e.g., FIGS. 6A to 6E).

a) A sintered piezo-stack (1) having lateral (temporary) isozones and external contact-connections (3) is provided (FIG. 1).

b) The piezo-stack (1) is dipped on one side (side C) into a suitable electrolyte solution (FIG. 2), (positive) voltage is applied to the piezo-stack (1) at the internal electrodes (2) via the external contact-connection (3) on the side B and, at the same time, to the internal electrodes (2') via the external electrode (3') (not shown) on the side D, negative voltage is applied to the counterelectrode (5), and energization takes place for a few minutes. All the electrodes are thereby etched back by 1 to 10 µm, preferably 1 to 5 µm, by means of the principle of electrochemical machining.

c) Afterward, the side C of the piezo-stack (1) is dipped into a plating technology coating basin and negative potential is applied to the internal electrodes (2) via the external contact-connection (3) on the side B of the piezo-stack (1). At the now voltage-carrying internal electrodes (2) (cathodes), the etched trenches (9) are filled again with conductive material.

d) Method steps b) and c) are now repeated analogously for the side A.

e) The trenches (9) are now filled with insulating material (e.g., glazed, or sealed with organic lacquer).

f) The surfaces A and C of the piezo-stack (1) are cleaned in such a way that surfaces of the outwardly situated electrodes are sufficiently free and suitable for a further metallization (e.g., sputtering, regrinding, etc.). The more deeply situated electrodes still remain insulated from the surface as a result of this cleaning step.

g) An external metallization is now applied on the sides A and C, and the piezo-stack (1) is singulated to form fully active piezo-stacks (12) and processed further.

In a fourth exemplary embodiment, the process sequence is as follows.

a) A sintered piezo-stack (1) having lateral (temporary) isozones and external contact-connections (3) is provided (FIG. 1).

b) The piezo-stack (1) is dipped by the side C into an electrolysis bath and voltage is applied to the internal electrodes (2) via the external contact-connection (3) on the side B, and etching back 1 to 10 µm, preferably 1 to 5 µm, is effected according to the principle of electrochemical etching-back.

c) Afterward, the side C of the component is dipped into a plating technology coating basin, and negative voltage is applied to the internal electrodes (2) via the external contact-connection (3) on the side B of the piezo-stack (1). A metal layer several µm thick is deposited (process of plating technology), preferably beyond the etching channel, at the now voltage-carrying internal electrodes (2) (cathodes). A material that differs from the material of the internal electrode (2) is preferably used here. With further preference, a metal or a metal mixture that is more electronegative than the metal of the internal electrode is used. By way of example, aluminum can be used.

d) Afterward, the electrolytic coating on the side C is oxidized by anodic oxidation. Particularly effective insulation can be produced in this way.

e) Steps b) to d) are repeated analogously for the side A of the bar.

f) The component is singulated.

g) An external metallization is now applied on the sides A and C.

Steps f) and g) can also be carried out in the reverse order.

In a fifth exemplary embodiment, the process sequence is as follows.

a) A sintered piezo-stack (i) having lateral (temporary) isozones and external contact-connections (3) is provided (FIG. 1).

b) The side C of the piezo-stack (i) is dipped into a plating technology coating basin and negative potential is applied to the internal electrodes (2) via the external contact-connection (3) on the side B of the piezo-stack (i). A metal layer several µm thick (typically 10 to 20 µm) is deposited (process of plating technology) at the now voltage-carrying internal electrodes (2) (cathodes).

c) Afterward, the electrolytic coating is converted into an oxide coating by anodic oxidation.

d) Method steps b) and c) are now repeated analogously for the side A.

e) The component is singulated (FIG. 4).

f) An external metallization is applied on the sides A and C.

Steps e) and f) can also be processed in the reverse order.

Figure 7:
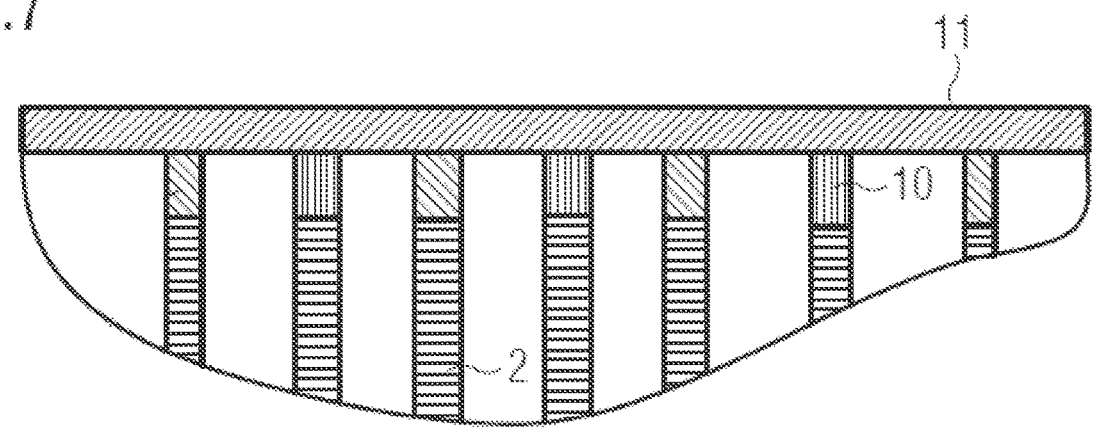
FIG. 7 shows a fully active piezo-stack finally provided with an external electrode and trenches closed by sintering.

In a sixth exemplary embodiment, the process sequence is as follows.

a) A green piezo-stack (i) having lateral (temporary) isozones and external contact-connections (3) is provided (FIG. 1).

b) The piezo-stack (i) is dipped on one side (side C) into a suitable electrolyte solution, and (positive) voltage is applied to the internal electrodes (2) via the external contact-connection (3) on the sides B and D and positive voltage is applied to the counterelectrode, and energization takes place for a few minutes. As a result, all the internal electrodes (2, 2') are etched back according to the principle of electrochemical machining.

c) Afterward, the side C of the component is dipped into a plating technology coating basin, and positive potential is applied to the internal electrodes (2) via the external contact-connection (3) of the piezo-stack (i). At the now voltage-carrying internal electrodes (2) (anodes), the etched trenches (9) are filled again with conductive material.

d) Method steps b) and c) are now repeated analogously for the side A.

e) The green piezo-stack (i) is sintered, the non-filled trenches (9) being closed by sintering. This is shown in FIG. 7.

f) The surfaces A and C of the piezo-stack (i) are cleaned, such that the surfaces of the plated internal electrodes (2) are sufficiently free and suitable for a further metallization (e.g., sputtering, regrinding, etc.). The more deeply situated internal electrodes (2') still remain insulated from the surface as a result of this cleaning step.

g) An external metallization is now applied on the sides A and C, and the sintered piezo-stack (i) is singulated to form fully active piezo-stacks (12) and processed further.

What is claimed is:

1. A fully active multilayer component comprising:
   a fully active stack comprising:
     a plurality of dielectric layers;
     internal electrodes; and
     two external electrodes arranged on opposite sides of the stack,
   wherein at least one portion of the internal electrodes is electrochemically coated,
   wherein the two external electrodes are electrically connected in each case either to an electrochemically coated internal electrode portion or to an electrochemically uncoated internal electrode portion,
   wherein an electrical connection to a portion of the internal electrodes is interrupted by an oxide layer on the internal electrodes or is provided by an electrolytic coating of the internal electrodes, and
   wherein the oxide layer contains a metal different from a metal contained in the internal electrodes.

2. The multilayer component according to claim 1, wherein the metal of the oxide layer is more electronegative than the metal of the internal electrodes.

3. The multilayer component according to claim 1, wherein the metal of the internal electrodes is copper while the metal of the oxide layer is aluminum.

4. A fully active multilayer component comprising:
a fully active stack comprising:
- a plurality of dielectric layers;
- internal electrodes; and
- two external electrodes arranged on opposite sides of the stack, wherein at least one portion of the internal electrodes is electrochemically coated, wherein the two external electrodes are electrically connected in each case either to an electrochemically coated internal electrode portion or to an electrochemically uncoated internal electrode portion, and wherein an electrical connection of the external electrodes to a portion of the internal electrodes is provided by an electrolytic coating of the internal electrodes and the electrical connection of the external electrodes to the rest of the internal electrodes is interrupted by a narrow isotone composed of ceramic and having a width of 50 μm to 200 μm.

5. The multilayer component according to claim 4, wherein the ceramic has a width of 50 μm to 100 μm.

6. The multilayer component according to claim 4, wherein the internal electrodes comprise copper.

\* \* \* \* \*

UNITED STATES PATENT AND TRADEMARK OFFICE
CERTIFICATE OF CORRECTION

PATENT NO. : 10,608,163 B2
APPLICATION NO. : 16/284744
DATED : March 31, 2020
INVENTOR(S) : Dieter Somitsch Page 1 of 1

It is certified that error appears in the above-identified patent and that said Letters Patent is hereby corrected as shown below:

In the Claims

In Column 9, Line 18, Claim 4, delete "isotone" and insert --isozone--.

Signed and Sealed this
Eighteenth Day of August, 2020

Andrei Iancu
*Director of the United States Patent and Trademark Office*